US005792286A

United States Patent [19]
Inoue et al.

[11] Patent Number: 5,792,286
[45] Date of Patent: Aug. 11, 1998

[54] HIGH-STRENGTH THIN PLATE OF IRON-NICKEL-COBALT ALLOY EXCELLENT IN CORROSION RESISITANCE, REPEATED BENDING BEHAVIOR AND ETCHABILITY, AND PRODUCTION THEREOF

[75] Inventors: Tadashi Inoue; Kiyoshi Tsuru; Naotsugu Yamanouchi; Tomoyoshi Okita, all of Tokyo, Japan

[73] Assignee: NKK Corporation, Tokyo, Japan

[21] Appl. No.: 406,648

[22] Filed: Mar. 20, 1995

Related U.S. Application Data

[63] Continuation of Ser. No. 271,566, Jul. 7, 1994, abandoned, which is a continuation of Ser. No. 98,328, filed as PCT/JP92/01622, Dec. 14, 1992 published as WO93/12263, Jun. 24, 1993, abandoned.

[30] Foreign Application Priority Data

Dec. 13, 1991 [JP] Japan ................................. 3-351364

[51] Int. Cl.$^6$ ............................ C22C 38/00; C22C 38/10
[52] U.S. Cl. ........................... 148/336; 148/442; 148/505; 148/650; 148/651; 148/707; 420/95; 420/581
[58] Field of Search ............................. 148/621, 650, 148/651, 707, 336, 442, 505; 420/95, 581

[56] References Cited

U.S. PATENT DOCUMENTS

| | | | |
|---|---|---|---|
| 4,028,144 | 6/1977 | Tomishima et al. | 420/582 |
| 5,147,470 | 9/1992 | Nakamura et al. | 148/442 |

FOREIGN PATENT DOCUMENTS

| | | | |
|---|---|---|---|
| 55-128565 | 10/1980 | Japan . | |
| 60-238446 | 11/1985 | Japan | 148/621 |
| 61-279628 | 12/1986 | Japan . | |
| 64-011099 | 2/1989 | Japan . | |
| 64-52024 | 2/1989 | Japan | 148/621 |
| 03-166340 | 7/1991 | Japan . | |

OTHER PUBLICATIONS

JIS Z-2371 -1988 established by MITI "Method of Neutral Salt Spray Testing"; revised Jun. 1, 1988; Japanese language text and corresponding English language text, both published by Japanese Standards Association.

*Primary Examiner*—Sikyin Ip
*Attorney, Agent, or Firm*—Frishauf, Holtz, Goodman, Langer & Chick, P.C.

[57] ABSTRACT

A high-strength thin plate, such as for IC lead frames, of an iron-nickel-cobalt alloy which is able to withstand repeated bending and is corrosion resistance and etchable, the alloy containing 27 to 30 wt. % Ni, 5 to 18 wt. % Co, 0.10 to 3.0 wt. % Mn, 0.10 wt. % or less Si, 0.010 to 0.075 wt. % C, 0.001 to 0.014 wt. % N, less than 2.0 ppm H, 0.0040 wt. % or less S, 0.004 wt. % or less P, 0.0050 wt. % or less O, 0.01 to 0.06 wt. % Cr, 0.01 to 1.0 wt. % Mo and the balance being Fe and unavoidable impurities wherein 63.5 wt. %≦2Ni+Co+Mn≦65 wt. % for Co<10 wt. % and 69.5 wt. %≦2Ni+Co+Mn≦74.5 wt. % for Co>10 wt. %.

10 Claims, 2 Drawing Sheets

ETCHING FACTOR $$Ef = \frac{2H}{(d_2 - d_1)}$$

5,792,286

HIGH-STRENGTH THIN PLATE OF IRON-NICKEL-COBALT ALLOY EXCELLENT IN CORROSION RESISITANCE, REPEATED BENDING BEHAVIOR AND ETCHABILITY, AND PRODUCTION THEREOF

This application is a continuation of application Ser. No. 08/271,566 filed Jul. 7, 1994 (abandoned), which is a continuation of application Ser. No. 08/098,328 filed Aug. 6, 1993 (abandoned), which is the United States national phase application of International Application No. PCT/JP92/01622 filed Dec. 14, 1992 published as WO93/12263, Jun. 24, 1993.

TECHNICAL FIELD

The present invention relates to high-strength Fe—Ni—Co alloy thin plate having excellent corrosion resistance, repeated bending behavior and etchability, and to the production method thereof. More particularly, it intends to provide high-strength material for IC lead frames of superior corrosion resistance and repeated bending behavior, and the optimum production method thereof.

BACKGROUND ART

In recent years, due to higher integration of semiconductor devices and reduction in package thickness, lead frames have shown a trend toward an increase in the number of pins and a reduction in thickness. For this reason, a further increase in strength is required for lead frame material.

In response to this requirement, the technology disclosed in JP.A 166340/1991 has recently been proposed for Fe high-strength multiple-pin lead frame material. This disclosed technology achieves an increase in strength (Hv of 260 or more and tensile strength of 80 kgf/mm$^2$ or more) without adversely affecting the various properties of lead frames, especially their solderability, plating property, and low temperature expansion property by producing a two-phase structure at a specific ratio by controlling the amounts of Ni and Co in Fe—Ni—Co alloy and by depositing an inverse transformation austenite phase by strain induced martensite transformation at a specific working rate and by subsequent annealing.

The above prior art achieves the properties of: Hv of 270~380, tensile strength of 85~117 kgf/mm$^2$, and average thermal expansion coefficient $\alpha_{RT-300}$ of 5.2~8.5×10$^{-6}$/°C., as well as excellent silver plating property, solderability, and crevice corrosion. However, it still has problems such as the following:

(1) Insufficient material corrosion resistance;

(2) Poor repeated bending (bending working) property;

(3) High strength material with Hv of 275 or more has a high thermal expansion coefficient ($\alpha_{RT-300}$=6.8×10$^{-6}$/°C. or more), increasing the risk of Si chips being damaged due to thermal distortion when mounted on lead frames in the IC production process; and (4) Considerable side etching occurs during the etching process (low etching factor), with a limit to the processing pitch.

Corrosion resistance is extremely poor because this material assumes a two-phase structure of martensite and austenite and the austenite phase includes an austenite phase with low dislocation density produced by inverse transformation, increasing the likelihood of surrounding corrosion between the residual austenite with high dislocation density and martensite. Also, due to product characteristics, rust spots occur on the material surface after coil production and before slit processing and fine processing of lead frames, etc., are performed, causing an extremely severe problem. With the ordinary 42 alloy (Fe - 42 wt % Ni), such a problem is nonexistent. It seems that the main cause of deteriorated corrosion resistance lies in the fact that this material is a low-Ni alloy with 32.5% or less of Ni and that metal phases having extremely different dislocation densities coexist in the same material.

The repeated bending behavior also deteriorates because, when high dislocation density and high strength residual austenite and martensite and low dislocation density and low strength inverse transformation austenite coexist, which is a characteristic of the above-mentioned material, stress concentration during bending concentrates on low strength inverse transformation austenite.

The thermal expansion property also deteriorates, if a further increase in strength is required, with an increase in martensite quantity due to stain induced transformation during cold rolling, which is a characteristic of this technology. Furthermore, mere balancing of thermal expansion and high strength, which is also a characteristic of this technology, is unsuitable for providing a quick response to the recent needs for high strength and low thermal expansion properties. More specifically, the component and structural ranges which satisfy the average thermal expansion $\alpha_{305-400°C.}$ of 4~7×10$^{-6}$/°C. and tensile strength of 120 kgf/mm$^2$ or more cannot be achieved with this technology.

With the recent demands for lower lead frame cost, there has been a strong trend toward thinner Ag plating. Thin plating has advanced beyond the Ag plating thickness (3 μm) of this technology. With respect to such demands, the alloy produced by this technology has a problem in regard to Ag plating property, in the current situation. In addition, although the solderability of this alloy achieved high performance in weather resistance in the above-mentioned JP.A 166340/1991, no improved technology was disclosed for wettability.

DISCLOSURE OF INVENTION

The present inventors conducted an extensive review in order to eliminate the problems associated with the above-mentioned prior art and have effectively achieved this objective by specifying the composition of this type of Fe—Ni—Co alloy and by specifying the structure as follows:

Ni: 27–30%, Co: 5–18%, Mn: 0.10–3.0%, Si: 0.10% or less in weight, the Ni, Co, and Mn content being 63.5%≦2Ni+Co+Mn≦65.0%, if Co is less than 10%; 69.5%≦2Ni+Co+Mn≦74.5%, if Co is 10% or more;

C: 0.010–0.075%, N: 0.001–0.014%, H: less than 2.0 ppm, S: 0.0040% or less, P: 0.004% or less, O: 0.0050% or less, Cr: 0.01 to 0.06%, and Mo: 0.01 to 1.0%, the rest consisting of Fe and unavoidable impurities, the residual austenite amount in the structure being 30–90%, and the crystal grains being regular with a grain size of No. 8 or larger.

It was also found that in the production of this type of Fe—Ni—Co alloy, the alloy may be produced properly if the primary cold rolling ratio (CR$_1$) is 60–80%;

the primary annealing temperature (T$_1$) is 700°–740° C.;

the secondary cold rolling ratio (CR$_2$) is 75–85%;

the secondary annealing temperature (T$_2$) is 700°–740° C.; and the tertiary cold rolling ratio (CR$_3$) is 20–70% when producing cold-rolled alloy material of said composition into sheets in the processes of primary cold rolling, primary annealing, secondary cold rolling, secondary annealing, and tertiary cold rolling.

BEST MODE FOR CARRYING OUT THE INVENTION

Figure 1A:
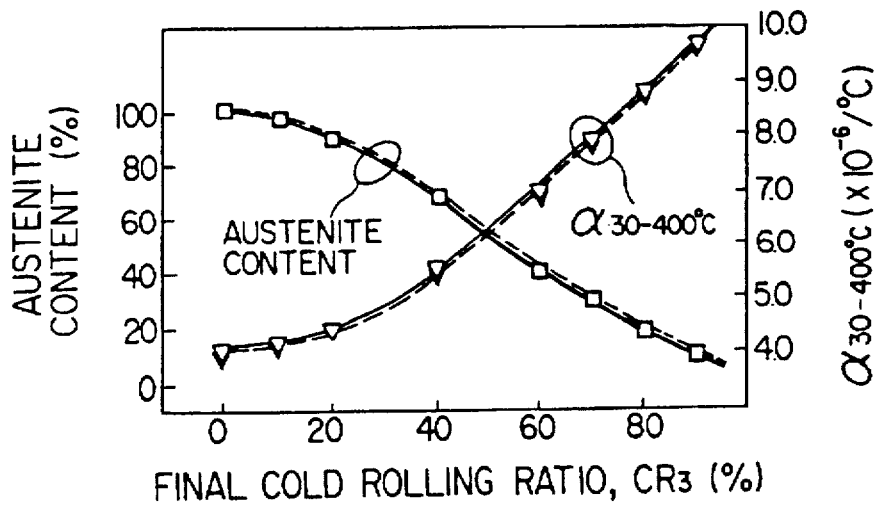
FIG. 1A, 1B and 1C are graphs is a graph indicating the relationship between the tensile strength, hardness, repeated bending behavior, $\alpha_{30°-400°\ C}$, austenite content, and final cold rolling ratio of Fe—Ni—Co alloy. In this graph, the black symbol indicates after low temperature heat treatment (500° C. for 1 min.) and the white symbol indicates before low temperature heat treatment.

Concerning the present invention described above, the reasons why the chemical components of the alloy should be restricted are described below in terms of wt % (hereinafter simply referred to as "%"). In order to achieve the low thermal expansion property, high strength, excellent repeated bending, etching, and corrosion resistance properties intended in the present invention, it is necessary to properly control the residual austenite amount in the structure. For this purpose, it is necessary to maintain the proper amounts of Co, Ni, Mn, Si, C, and N, as follows.

If the Si content exceeds 0.10%, the martensite transforming temperature becomes high and austenite becomes unstable, causing martensite transformation to occur in the cooling process during solution treatment, preventing the residual austenite amount intended in the present invention from being obtained even if the proper amounts of Co, Ni, and Mn are maintained (to be described later) and also preventing the level of plating property intended in the present invention from being obtained. For this reason, the upper limit is set to 0.10%. For improved solderability, a more appropriate Si amount would be 0.05% or less.

If the Co content is less than 5% or exceeds 18%, the thermal expansion coefficient becomes large, deteriorating thermal expansion compatibility with the silicon chip. For this reason, the Co content is set to the range of 5–18%.

If the Ni content is less than 27% or exceeds 30%, the thermal expansion coefficient becomes large, deteriorating thermal expansion compatibility with the silicon chip. For this reason, the Ni content is set to the range of 27–30%.

If the Mn content exceeds 3.0%, austenite stabilizes, making the occurrence of strain induced transformation difficult. If it is less than 0.1%, the martensite transforming temperature becomes high and austenite becomes unstable, facilitating the occurrence of strain induced martensite transformation during cold working, with the result that a sufficient amount of residual austenite cannot be obtained. From the above, the upper limit of the Mn amount is set to 3.0% and the lower limit to 0.1%.

In order to achieve the properties intended in the present invention, not only must the above individual addition amounts be specified but also the total amount of Ni, Co, and Mn must be controlled in accordance with the Co amount. More specifically, if the Co content is less than 10% and that of (2Ni+Co+Mn) is less than 63.5% or if the Co content is 10% or more and that of (2Ni+Co+Mn) is less than 69.5%, the martensite transforming temperature becomes high and austenite becomes unstable, facilitating the occurrence of strain induced martensite transformation, with the result that a sufficient amount of residual austenite cannot be obtained.

If the Co content is less than 10% and that of (2Ni+Co+Mn) exceeds 65.0% or if the Co content is 10% or more and that of (2Ni+Co+Mn) exceeds 74.5%, austenite becomes stable, making the occurrence of working-induced martensite transformation difficult. From the above, the Ni, Co, and Mn content is restricted in order to meet the following conditions:

63.5%≦2Ni+Co+Mn≦65.0%, if Co is less than 10%; and
69.5%≦2Ni+Co+Mn≦74.5%, if Co is 10% or more.

A more favorable 2Ni+Co+Mn range for 10% or more of Co is 69.5%≦2Ni+Co+Nm≦72.5%.

In the present invention, C and N are the elements which are essential to properly control strain induced martensite transformation and to achieve further increase in strength during the final aging treatment. More specifically, if the C content is less than 0.010%, austenite becomes unstable, facilitating the occurrence of strain induced martensite transformation, with the result that it is impossible to obtain sufficient residual austenite and that strength increase due to age hardening cannot be expected. On the contrary, if it exceeds 0.075%, austenite becomes stable, making the occurrence of strain induced martensite transformation difficult, and deteriorating the plating property as well. From the above, the lower limit for C is set to 0.010% and the upper limit to 0.075%. A more favorable C amount range is 0.020–0.070%.

If the N content exceeds 0.014%, austenite becomes stable, making the occurrence of working-induced martensite transformation difficult, and deteriorating the plating property as well. From the above, the upper limit for N is set to 0.014%. If the N content is less than 0.001%, austenite becomes unstable, causing martensite transformation in the cooling process during solution treatment, with the result that the residual austenite intended in the present invention cannot be obtained. From the above, the lower limit is set to 0.001%. The addition of an N amount in the range of 0.014% or less is appropriate because strength may then be increased due to age hardening if low temperature heat treatment is performed. In addition, if the N content is in the range of 0.014% or less, all of the properties of low thermal expansion, high strength, excellent repeated bending, corrosion resistance, etching, and plating intended in the present invention may be obtained. A more favorable N amount range is 0.001–0.010%.

In the present invention, in addition to the above component requirements, a reduction in the S and O amounts is necessary in order to improve the repeated bending behavior. Also, a reduction in the H, S, P, and O amounts and maintaining the proper Cr amount are essential in order to further improve the plating property intended in the present invention.

More specifically, S and O are elements which adversely affect the repeated bending and plating properties of this alloy through the formation of non-metallic inclusions. If the S content exceeds 0.0040%, the repeated bending behavior deteriorates and prevents the level of plating property intended in the present invention from being obtained. From the above, the upper limit is set to 0.0040%. A favorable S amount range for solderability is 0.003% or less and a more favorable S amount range is 0.0010% or less.

If the O content exceeds 0.0050%, the repeated bending behavior of this alloy deteriorates and the level of plating property intended in the present invention cannot be obtained. From the above, the upper limit is set to 0.0050%. A favorable O amount range for solderability is 0.0040% or less and a more favorable O amount range is 0.0020% or less.

The mechanism of repeated bending behavior deterioration due to the presence of S and O, in the case of this alloy, is considered to be the formation of cracks starting from non-metallic inclusions, because of the fact that numerous non-metallic inclusions at places where S or O are detected are found in interfaces ruptured by bending.

With the alloy of the present invention, in order to improve solderability up to the intended level, a reduction in the H and P content and maintaining the proper amount of Cr are essential, in addition to a reduction in the O and S content mentioned above. More specifically, P is deposited on the surface during the heat treatment process of the steel strip of this alloy, causing deterioration of plating property. If the P content exceeds 0.004%, the plating property intended in the present invention cannot be obtained. From the above, the upper limit is set to 0.004%. A favorable P amount range for solderability is 0.003% or less and a more favorable P amount range is 0.001% or less.

Cr improves the corrosion resistance and the etchability (etching factor) of this alloy. However, it forms a strong oxide film on the surface during the heat treatment process of the steel strip of this alloy and deteriorates the plating property. If the Cr content is less than 0.01%, the corrosion resistance and etching properties intended in the present invention cannot be obtained. From the above, the lower limit is set to 0.01%. If the Cr content exceeds 0.06%, the plating property intended in the present invention cannot be obtained. From the above, the upper limit is set to 0.06%. Within the Cr amount range of the present invention, a more favorable Cr amount range for solderability is 0.02% or less.

H is an element which greatly affects the solderability of the alloy of the present invention. More specifically, H enters this alloy unavoidably during the production process. The amount of H exceeds 2.0 ppm in the background art and can be as high as about 4 to 5 ppm in some cases. This gas is released during the heating of die bonding after Ag spot plating in the IC production process and moves to the interface between the plating layer and the substrate alloy (lead frame material), causing plating defects called "blisters". This phenomenon does not present a problem when the Ag plating layer is relatively thick (about 3 μm), because of plating layer strength. However, due to the recent trend toward thinner Ag plating, a plating thickness of 2 μm or less has become common. With such an Ag plating thickness, the strength of the Ag plating layer is less than the H gas pressure, resulting in the above-mentioned problem of "blister" formation. Also, when soldering is performed on this alloy type containing the above conventional level of H, the problem of poor solder wettability arises.

The adverse effect of the above-mentioned very low amount of H on plating property is distinct, especially with the alloy of the present invention which contains martensite (α'), as compared with conventional alloys with a single austenite phase such as 42 alloy and Kovar.

If the above-mentioned H content is 2.0 ppm or more, the alloy cannot achieve the plating property intended in the present invention. From the above, the H content is set to less than 2.0 ppm. A more favorable H amount range is 1.0 ppm or less for the present invention. In order to achieve the level of H specified in the present invention, it is necessary to optimize the method of vacuum degassing during the production of this alloy. More specifically, in order to reduce the apparent partial pressure of hydrogen, it is preferable, for the alloy of the present invention, to achieve a high degree of vacuum of 0.1 Torr or higher during degassing and to adopt a method of increasing the bottom blow dilution Ar gas amount.

In order to improve corrosion resistance while ensuring the properties of low thermal expansion, high strength, excellent repeated bending and plating intended in the present invention, it is essential to add an appropriate amount of Mo. If the Mo content is 0.01% or less, corrosion resistance cannot be improved. If it exceeds 1.0%, the thermal expansion and plating properties intended in the present invention are impaired. From the above, the Mo addition amount is set to 0.01 to 1.0%.

With the alloy of the present invention, since the C content is higher than in conventional alloys because of structural control, corrosion resistance is apt to deteriorate if C exists at the boundaries between crystal grains or between phases. Mo is considered to improve corrosion resistance at the crystal grain boundaries where localized corrosion resistance deterioration occurs and at the boundaries between the residual austenite and the martensite phases through intergranular segregation and concentration.

In the present invention, the corrosion resistance of this alloy is further improved without deteriorating the other properties intended in the present invention by including a total of 0.01–0.50% of one or more of B, Nb, Ti, Zr, Ta, V, and W, in addition to Mo mentioned above. If the added amount is less than 0.01%, further improvement in corrosion resistance cannot be achieved. If it exceeds 0.5%, the thermal expansion and plating properties intended in the present invention cannot be obtained. From the above, the necessary amount to be added in order to further improve corrosion resistance is set to 0.01–0.50%.

The final structure is determined by the residual austenite phase during solution treatment and the strain induced martensite phase. If the residual austenite is less than 30%, the thermal expansion property intended in the present invention cannot be obtained, and if it exceeds 90%, the alloy strength intended in the present invention cannot be obtained. For this reason, it is specified that the structure consist of two phases—the residual austenite phase and strain induced martensite phase—and that said residual austenite phase be 30% or more and 90% or less. The residual austenite referred to in the present invention means the following: Due to the cold rolling of the austenite phase after annealing, a part of the austenite is subject to strain induced transformation and changes to martensite and the other part remains untransformed as austenite. This austenite is called residual austenite.

In the present invention, the amount of residual austenite phase (%) was determined by X-ray diffraction strength, as follows:

$$Vf = \frac{Vf_1 + Vf_2}{2} \quad (1)$$

$$Vf_1 = \frac{1}{1 + G_1 \cdot \frac{I\alpha(200)}{I\gamma(220)}} \quad (1\text{-}1)$$

$$Vf_2 = \frac{1}{1 + G_2 \cdot \frac{I\alpha(200)}{I\gamma(311)}} \quad (1\text{-}2)$$

In order to further improve the repeated bending and etching properties of this alloy, it is important to control the final-structure crystal grain diameter, in addition to the above-mentioned component requirements. The present inventors studied the relationship between the crystal grain size and repeated bending behavior, and the etchability of the alloy whose components and whose austenite phase amount in the final structure are within the requirements of the present invention. As a result, it was found that regular grains with a crystal grain size of No. 8 or larger exhibited excellent levels: a repeated bending behavior of two times or more and an etchability (etching factor) of 2.4 or more. From the above, the crystal grain size range which allows excellent repeated bending and etchability to be obtained is set to No. 8 or larger in the present invention. A regular grain structure means a structure which does not contain coarse grains with a crystal grain size of No. 7 or smaller.

Next, in the production method of the alloy of the present invention, in order to obtain the above-mentioned structure (austenite amount and crystal grain size), it is necessary to adopt the processes of two repetitions of cold rolling and annealing followed by cold rolling, without performing solution treatment on the cold rolled material and also to optimize the conditions in each process.

More specifically, the structure intended in the present invention may be accurately obtained by setting the primary cold rolling ratio ($CR_1$), secondary cold rolling ratio ($CR_2$), and the annealing temperatures ($T_1$ and $T_2$) after the primary and the secondary cold rolling processes as follows:

$CR_1$: 60–80%; . . . (2-1)

$CR_2$: 75–85%; . . . (2-2)

$T_1$: 700°–740° C.; . . . (2-3)

$T_2$: 700°–740° C.; . . . (2-4)

$CR_3$: 20–70% . . . (2-5)

If $CR_1$ is less than 60% and/or $CR_2$ is less than 75%, the final structure is a coarse grain one with a crystal grain size of smaller than No. 8, thus preventing the repeated bending and etching properties intended in the present invention from being obtained. If $CR_1$ exceeds 80% and/or $CR_2$ exceeds 85%, the final structure is a mixed grain one containing coarse grains with a crystal grain size of No. 7 or smaller, and the repeated bending and etching properties intended in the present invention cannot be obtained. From the above, $CR_1$ and $CR_2$ are set to 60–80% and 75–85%, respectively.

It is necessary for the annealing temperature after the primary and the secondary cold rolling processes to be 700°–740° C. If the annealing temperature is lower than 700° C., a perfect recrystallized structure cannot be obtained after annealing, and even if the production conditions other than the annealing temperature are within the requirements of the present invention, the final structure is a mixed grain one containing coarse grains with a crystal grain size of No. 7 or smaller, thus preventing the repeated bending and etching properties intended in the present invention from being obtained. If the annealing temperature exceeds 740° C. a coarse grain structure with a crystal grain size of No.7 or smaller is obtained after annealing, and the final structure is a coarse and mixed grain structure with a crystal grain size of No. 7 or smaller even if the production conditions other than the annealing temperature are within the requirements of the present invention, thus preventing the repeated bending and etching properties intended in the present invention from being obtained.

From the above, the annealing temperature for this alloy is set to 700°–740° C. as an annealing condition under which the final structure is a regular grain one with a crystal grain size of No. 8 or larger. With the present invention, the repeated bending behavior may be further improved by performing proper low temperature heat treatment after the above tertiary cold rolling.

As described above, in the present invention, the control of the final structure, mechanical properties, and thermal expansion property is realized by maintaining a proper draft during the final cold rolling (tertiary cold rolling) process, and more favorably, by performing proper low temperature heat treatment.

Figure 1B:
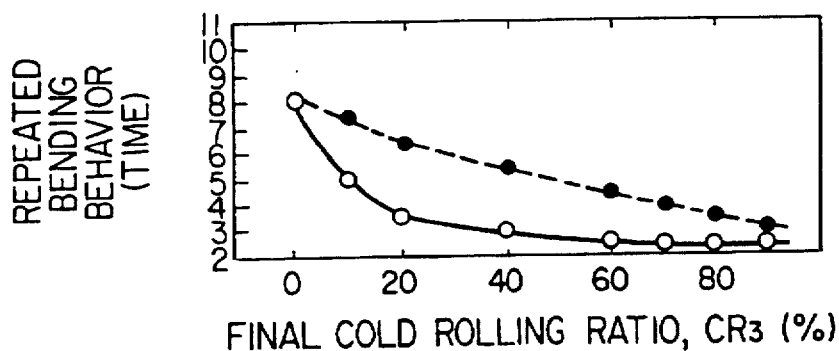
Figure 1C:
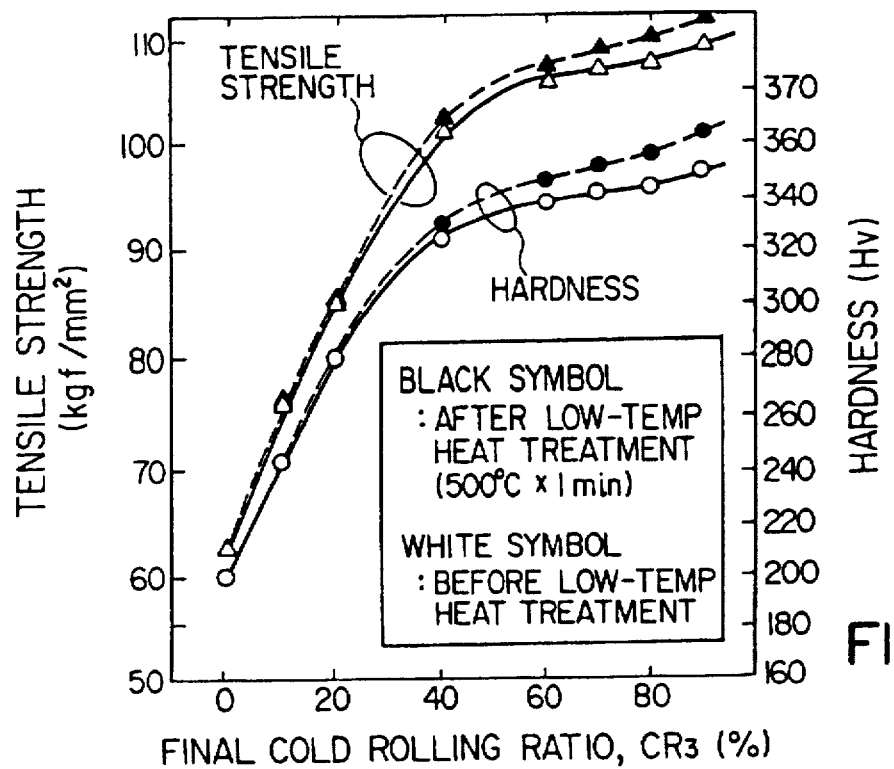

FIG. 1A–1C indicate the relationship between the mechanical properties (tensile strength, repeated bending behavior, and hardness), austenite amount, thermal expansion coefficient, and the final cold rolling rate of the material of alloy No. 1 (to be described later) of the present invention when $CR_1$, $CR_2$, $T_1$, and $T_2$ are within the requirements of the present invention, after the final cold rolling, and after the low temperature annealing process. FIGS. 1A–1C indicate that if the cold rolling rate of the final cold rolling process is less than 20%, the strength and hardness intended in the present invention cannot be obtained. If the cold rolling rate exceeds 70%, the strength and hardness intended in the present invention are obtained but the intended level of thermal expansion coefficient cannot be obtained. If the cold rolling rate is 20% or more and 70% or less, the residual austenite amount is 30% or more and 90% or less, respectively.

From the above technological relationship, the residual austenite amount which allows the strength, hardness, repeated bending behavior, and thermal expansion coefficient intended in the present invention to be obtained, is set to 30–90% and the cold rolling rate at which this austenite amount may be obtained is set to 20–70%.

In the present invention, the above proper low temperature annealing is preferable after the final cold rolling process to further improve strength and also to improve the repeated bending property without deteriorating the thermal expansion property, as shown in FIGS. 1A–1C.

If this heat treatment is performed at lower than 400° C. and/or for shorter than 0.5 minute, sufficient age hardening cannot be obtained, and if performed at higher than 540° C. and/or for longer than 30 minutes, inverse transformation austenite is produced in the alloy, preventing the strength intended in the present invention from being obtained. Furthermore, this inverse transformation austenite has a lower dislocation density than the other metal phases (residual austenite and strain induced martensite) and the presence of this phase deteriorates the repeated bending and corrosion resistance properties. From the above, the low temperature heat treatment conditions under which high strength is obtained due to sufficient age hardening, and excellent repeated bending, etching, and corrosion resistance properties are exhibited, are set as follows:

$T_3$: 400°–540° C.; . . . (3-1)

t: 0.5–30 min. . . . (3-2)

In the above alloy production method, superior properties (strength, repeated bending, thermal expansion, etc.) may be attained by properly selecting the conditions in accordance with the alloy composition within the requirements of the present invention.

As for $\alpha_{30°-400°\,C.}$ (average thermal expansion coefficient between 30° C. and 400° C.), hardness, and tensile strength, as a result of reviewing the package assembly process and the conditions in use, $\alpha_{30°-400°\,C.}$ of $(4 \text{ to } 8) \times 10^{-6}/°C.$, hardness Hv of $\geq 280$, and tensile strength of 85 kgf/mm$^2$ or more can adequately withstand use, and therefore, the above property values are specified as the ranges for the present invention.

(DETAILED DESCRIPTION OF THE PREFERRED EMBODIMENTS)

The preferred embodiments of the present invention are described below.

EMBODIMENT 1

The alloys of the present invention and the comparison alloys having the chemical components shown in Table 1 were melted in a vacuum melting furnace and cast into ingots, which were then bloomed, hot rolled, descaled, and cleared of surface flaws, to provide cold rolled materials 2.5 mm in thickness.

TABLE 1

| Specimen No. | C | Si | Mn | P | S | N | O | Cr | Mo | H (ppm) | Ni | Co | 2Ni + Co + Mn | Other | Note |
|---|---|---|---|---|---|---|---|---|---|---|---|---|---|---|---|
| 1 | 0.060 | 0.03 | 0.40 | 0.001 | 0.0005 | 0.003 | 0.0010 | 0.01 | 0.50 | 0.5 | 27.82 | 16.45 | 72.49 | V 0.05 | Alloy |
| 2 | 0.055 | 0.04 | 0.48 | 0.001 | 0.0010 | 0.001 | 0.0015 | 0.01 | 0.51 | 0.8 | 27.50 | 16.51 | 71.99 | — | of the |
| 3 | 0.032 | 0.04 | 0.15 | 0.001 | 0.0008 | 0.008 | 0.0019 | 0.01 | 0.10 | 0.5 | 27.95 | 16.40 | 72.45 | W 0.10 | Present |
| 4 | 0.026 | 0.06 | 0.45 | 0.002 | 0.0015 | 0.002 | 0.0024 | 0.02 | 0.15 | 0.7 | 29.03 | 11.05 | 69.56 | Nb 0.05 Zr 0.06 | Invention |
| 5 | 0.035 | 0.06 | 0.48 | 0.002 | 0.0017 | 0.006 | 0.0022 | 0.02 | 0.10 | 0.7 | 29.00 | 5.77 | 64.25 | Ta 0.05 B 0.01 | |
| 6 | 0.052 | 0.07 | 0.30 | 0.003 | 0.0022 | 0.002 | 0.0020 | 0.03 | 0.20 | 0.5 | 27.51 | 16.50 | 71.82 | Tr 0.02 | |
| 7 | 0.052 | 0.02 | 2.51 | 0.001 | 0.0007 | 0.001 | 0.0012 | 0.01 | 0.45 | 0.5 | 27.76 | 16.32 | 74.35 | W 0.06 | |
| 8 | 0.081 | 0.08 | 0.40 | 0.003 | 0.0025 | 0.001 | 0.0032 | 0.04 | 0.40 | 0.7 | 27.80 | 16.47 | 72.47 | — | Comparison |
| 9 | 0.006 | 0.10 | 0.48 | 0.003 | 0.0023 | 0.001 | 0.0040 | 0.03 | — | 0.6 | 28.32 | 6.05 | 63.17 | Cu 2.45 | Alloy |
| 10 | 0.020 | 0.15 | 0.50 | 0.003 | 0.0020 | 0.001 | 0.0035 | 0.03 | — | 0.6 | 28.92 | 11.00 | 69.34 | — | |
| 11 | 0.025 | 0.06 | 3.50 | 0.003 | 0.0021 | 0.002 | 0.0030 | 0.04 | 0.10 | 0.5 | 28.05 | 11.10 | 69.70 | — | |
| 12 | 0.021 | 0.06 | 0.05 | 0.003 | 0.0017 | 0.002 | 0.0021 | 0.03 | 0.12 | 0.8 | 27.85 | 16.39 | 72.14 | — | |
| 13 | 0.037 | 0.07 | 0.10 | 0.005 | 0.0016 | 0.001 | 0.0027 | 0.03 | 0.15 | 0.7 | 27.72 | 16.48 | 72.02 | — | |
| 14 | 0.025 | 0.06 | 0.25 | 0.002 | 0.0041 | 0.001 | 0.0025 | 0.04 | 0.40 | 0.7 | 27.90 | 16.35 | 72.40 | — | |
| 15 | 0.030 | 0.06 | 0.55 | 0.002 | 0.0013 | 0.015 | 0.0024 | 0.03 | 0.80 | 0.6 | 27.67 | 16.50 | 72.39 | — | |
| 16 | 0.023 | 0.08 | 0.60 | 0.002 | 0.0020 | 0.002 | 0.0051 | 0.04 | 0.65 | 0.6 | 29.00 | 11.02 | 69.62 | — | |
| 17 | 0.027 | 0.08 | 0.75 | 0.003 | 0.0020 | 0.001 | 0.0021 | 0.07 | 0.50 | 0.7 | 28.97 | 10.89 | 69.58 | — | |
| 18 | 0.025 | 0.08 | 0.35 | 0.003 | 0.0024 | 0.002 | 0.0039 | 0.04 | — | 0.7 | 29.10 | 6.02 | 64.57 | — | |
| 19 | 0.041 | 0.09 | 0.10 | 0.003 | 0.0018 | 0.002 | 0.0033 | 0.04 | 0.45 | 2.0 | 28.95 | 5.74 | 63.94 | — | |
| 20 | 0.007 | 0.17 | 0.48 | 0.003 | 0.0015 | 0.001 | 0.0030 | 0.05 | — | 0.8 | 27.72 | 16.53 | 74.85 | — | |
| 21 | 0.005 | 0.12 | 0.50 | 0.003 | 0.0019 | 0.001 | 0.0036 | 0.05 | — | 0.8 | 29.27 | 6.45 | 65.49 | — | |
| 22 | 0.060 | 0.02 | 0.41 | 0.001 | 0.0004 | 0.002 | 0.0011 | <0.01 | 0.51 | 0.6 | 28.00 | 16.09 | 72.50 | — | |

The cold rolled materials obtained in the above manner subsequently underwent a series of processes: primary cold rolling (draft: 60%), annealing (730° C., 2 min.), secondary cold rolling (draft: 75%), annealing (720° C., 2 min.), and tertiary cold rolling (draft: 60%) to provide alloy sheets 0.10 mm in thickness. Each alloy sheet thus obtained was studied for each of the property values shown in Tables 2 and 3 below.

TABLE 2

| | Structure | | | Mechanical Properties | | | |
|---|---|---|---|---|---|---|---|
| Specimen Number | Residual Austenite Content (%) | Crystal Grain Size Number | Regular[1] Grain Degree | Hardness (Hv) | Tensile Strength (kgf/mm$^2$) | Repeated bending Behavior (times) | Note |
| 1 | 40 | 10.0 | Regular Grain | 338 | 106.0 | 2.5 | Alloy |
| 2 | 37 | 10.0 | Regular Grain | 337 | 105.8 | 3.0 | of the |
| 3 | 39 | 10.0 | Regular Grain | 337 | 106.0 | 2.5 | Present |
| 4 | 35 | 10.5 | Regular Grain | 306 | 93.0 | 3.0 | Invention |
| 5 | 30 | 10.5 | Regular Grain | 312 | 95.1 | 3.0 | |
| 6 | 34 | 10.0 | Regular Grain | 313 | 95.5 | 3.5 | |
| 7 | 42 | 10.0 | Regular Grain | 334 | 104.6 | 3.0 | |
| 8 | 95 | 10.0 | Regular Grain | 242 | 75.8 | 5.0 | Comparison |
| 9 | 5 | 9.0 | Regular Grain | 325 | 101.2 | 2.0 | Alloy |
| 10 | 0 | 9.5 | Regular Grain | 348 | 119.2 | 1.5 | |
| 11 | 100 | 9.5 | Regular Grain | 210 | 66.0 | 2.0 | |
| 12 | 0 | 9.5 | Regular Grain | 350 | 109.4 | 2.0 | |
| 13 | 37 | 9.0 | Regular Grain | 342 | 107.1 | 2.0 | |
| 14 | 36 | 10.0 | Regular Grain | 341 | 107.0 | 1.0 | |
| 15 | 100 | 9.0 | Regular Grain | 213 | 67.0 | 2.0 | |
| 16 | 33 | 10.0 | Regular Grain | 307 | 93.5 | 1.0 | |
| 17 | 35 | 9.0 | Regular Grain | 305 | 92.8 | 2.0 | |
| 18 | 28 | 10.0 | Regular Grain | 310 | 94.2 | 2.0 | |
| 19 | 32 | 9.5 | Regular Grain | 312 | 95.0 | 2.0 | |
| 20 | 95 | 9.5 | Regular Grain | 338 | 74.5 | 2.0 | |
| 21 | 93 | 9.0 | Regular Grain | 250 | 77.5 | 2.0 | |
| 22 | 93 | 9.0 | Regular Grain | 340 | 106.2 | 2.0 | |

[1]Regular grains mean a structure which does not contain coarse grains of a crystal grain size No. 7 or smaller.
Mixed grains mean a structure which contains coarse grains of a crystal grain size of No. 7 or smaller.

TABLE 3

| Specimen Number | α30–400° C. (×10⁻⁶/°C.) | Ag [2] Plating Property | Solderability[3] | Frequency of Rust Spot Occurrence (number of spots/100 cm²) | Etching Factor | Note |
|---|---|---|---|---|---|---|
| 1  | 6.8  | ○ | ◎ | 0.0  | 2.4 | Alloy |
| 2  | 7.2  | ○ | ◎ | 0.4  | 2.4 | of the |
| 3  | 6.8  | ○ | ◎ | 0.3  | 2.4 | Present |
| 4  | 7.7  | ○ | ○ | 0.2  | 2.5 | Invention |
| 5  | 7.9  | ○ | ○ | 0.1  | 2.5 | |
| 6  | 7.8  | ○ | ○ | 0.2  | 2.6 | |
| 7  | 6.5  | ○ | ◎ | 0.0  | 2.4 | |
| 8  | 4.1  | X | X | 0.6  | 2.3 | Comparison |
| 9  | 9.0  | ○ | △ | 6.3  | 2.3 | Alloy |
| 10 | 9.1  | X | X | 5.2  | 2.3 | |
| 11 | 8.4  | ○ | ○ | 1.1  | 2.3 | |
| 12 | 11.0 | ○ | ○ | 0.9  | 2.2 | |
| 13 | 4.0  | X | X | 0.8  | 2.2 | |
| 14 | 7.3  | X | X | 0.9  | 2.1 | |
| 15 | 4.1  | X | X | 0.6  | 2.3 | |
| 16 | 7.9  | X | X | 0.8  | 2.3 | |
| 17 | 7.8  | X | X | 0.8  | 2.3 | |
| 18 | 8.0  | ○ | ◎ | 7.7  | 2.2 | |
| 19 | 7.8  | X | X | 1.3  | 2.2 | |
| 20 | 6.7  | X | X | 7.4  | 2.2 | |
| 21 | 8.4  | X | X | 8.3  | 2.2 | |
| 22 | 6.9  | ○ | ◎ | 10.0 | 2.0 | |

[2]Ag Plating Property:
○ No Blisters;
X Blisters
[3]Solderability:
◎ wet time $t_2$ 0.5 sec or shorter;
○ wet time $t_2$ exceeds 0.5 sec and is 1.0 sec or shorter;
△ wet time $t_2$ exceeds 1.0 sec and is 2.0 sec or shorter; and
X wet time exceeds 2.0 sec.

The residual austenite amounts in Table 2 were determined using the X-ray diffraction technique described above. The Ag plating property in Table 3 was determined by performing 0.5 μm-thick Cu strike plating on said alloy sheets after solvent decreasing, electrolytic decreasing, and acidification, and then applying 2 μm-thick Ag plating on them, heating them in an atmosphere at 450° C. for 5 minutes, and checking the plating layers for the presence of blisters at a magnification factor of 50.

The solderability in Table 3 was determined as follows:

1.5 μm-thick tin plating was applied to said alloy sheets, which were then immersed in a solder bath of a solder composition of 60% Sn and 40% Pb, a solder bath temperature of 235° C.±5° C., an immersion depth of 2 mm, and an immersion time of 5 seconds, using the Meniscograph method, and evaluation was performed with solder wet time $t_2$. Concerning corrosion resistance, the salt spray test conforming to JIS Z 2371 was conducted on said alloy sheets for 100 hours, after which the frequency of rust spot occurrence was examined. The etching factor was determined by performing photo etching and using the method shown in Table 2.

From the results in Tables 2 and 3, each of specimens Nos. 1 to 7 meets the component requirements of the present invention, exhibiting the structure, mechanical properties, thermal expansion, plating, etching, and corrosion resistance properties intended in the present invention. These properties are superior to those of the comparison examples. Specimens Nos. 1 to 3, and 7, in particular, have the Si, P, S, O, and Cr content reduced to more favorable levels within the ranges of the present invention, in contrast to specimens Nos. 4 to 6, thus exhibiting superior levels of solderability. Specimens Nos. 1, and 3 to 7 have the elements for the further improvement of corrosion resistance added within the requirements of the present invention, in addition to Mo.

It is clear that they exhibit a lower frequency of rust spot occurrence and superior corrosion resistance to specimen No. 2, to which none of these elements were added.

As compared with these examples of the present invention, specimen No. 22 having a Cr amount of less than the lower limit specified by the present invention, is extremely poor in corrosion resistance and etchability. This suggests that the addition of a proper amount of Cr is essential for the present invention. Specimen No. 8, whose C amount exceeds the upper limit specified by the present invention, has a residual austenite amount exceeding the upper limit specified by the present invention, and the required strength cannot be obtained and the plating property is also poor. Specimen No. 9, whose C amount and 2Ni+Co+Mn amount are less than the lower limits of the present invention, has a residual austenite amount less than the requirement of the present invention, preventing the required thermal expansion property from being obtained.

Specimen No. 10, whose Si amount exceeds the upper limit specified by the present invention and whose 2Ni+Co+Mn amount is less than the lower limit specified by the present invention, has a residual austenite amount less than the specified lower limit, and is poor in thermal expansion property with $\alpha_{30°-400°\,C.}$ exceeding $8\times10^{-6}$ °C., and is also poor in plating property. Specimen No. 11, whose Mn amount exceeds the upper limit specified by the present invention and whose residual austenite amount exceeds the specified upper limit, cannot achieve the required strength. Specimen No. 12, whose Mn amount is less than the lower limit specified by the present invention, has a residual austenite amount less than the specified lower limit, and cannot achieve the required thermal expansion property.

Specimens Nos. 13 to 17, whose P, S, N, O, and Cr amounts exceed the upper limits specified by the present invention, each have plating properties inferior to those of the examples of the present invention. Specimens Nos. 14 and 16, in particular, have repeated bending behavior far inferior to the other comparison examples.

Specimen No. 19, whose H amount exceeds the upper limit specified by the present invention, has a plating property inferior to the examples of the present invention. Specimens Nos. 20 and 21, whose 2Ni+Co+Mn amounts exceed the upper limit specified by the present invention, both have residual austenite amounts exceeding the specified upper limit, and cannot achieve the required strength. Their Si amounts also exceed the upper limit specified by the present invention, resulting in poor plating property.

Specimens Nos. 18, 20, and 21 represent the alloy described in JP.A 166340/1991. None of these materials can achieve the Ag plating property, solderability, and the corrosion resistance intended in the present invention and it is clear that such intended effects cannot be achieved with the prior art alone. Specimen No. 18 is a case where Mo is less than the requirement of the present invention. In this case, the frequency of rust occurrence is far higher than in the examples of the present invention, and corrosion resistance is poor. This indicates that the addition of a proper amount of Mo is essential for the present invention.

As stated above, this embodiment has made it clear that the structure, mechanical properties, thermal expansion, plating, etching, and corrosion resistance properties intended in the present invention can only be achieved when the component requirements of the present invention are satisfied.

EMBODIMENT 2

The same heat rolled materials as those in embodiment 1 (alloys of the present invention and comparison alloys, specimens Nos. 1 to 22, having the chemical components shown in table 1) were used as cold rolled materials, which underwent a series of processes: primary cold rolling (draft: 60%), annealing (730° C., 2 min.), secondary cold rolling (draft: 75%), annealing (720° C., 2 min.), tertiary cold rolling (draft: 60%), and low temperature heat treatment (500° C., 1 min.) to provide alloy sheets 0.10 mm in thickness (specimens Nos. 23 to 44). Each of the alloy sheets thus obtained were investigated for each property value shown in Tables 4 and 5.

TABLE 4

| | Structure | | | Mechanical Property | | | |
|---|---|---|---|---|---|---|---|
| Specimen Number | Residual Austenite Content (%) | Crystal Grain Size Number | Regular[1] Grain Degree | Hardness (Hv) | Tensile Strength (kgf/mm$^2$) | Repeated bending Behavior (times) | Note |
| 23 | 40 | 10.0 | Regular Grain | 346 | 107.5 | 4.5 | Alloy |
| 24 | 37 | 10.0 | Regular Grain | 345 | 107.0 | 5.0 | of the |
| 25 | 39 | 10.0 | Regular Grain | 345 | 107.2 | 4.5 | Present |
| 26 | 35 | 10.5 | Regular Grain | 308 | 93.5 | 5.0 | Invention |
| 27 | 30 | 10.5 | Regular Grain | 315 | 95.7 | 5.0 | |
| 28 | 34 | 10.0 | Regular Grain | 316 | 97.5 | 5.5 | |
| 29 | 42 | 10.0 | Regular Grain | 342 | 106.4 | 5.0 | |
| 30 | 95 | 10.0 | Regular Grain | 243 | 76.0 | 7.0 | Comparison |
| 31 | 5 | 9.0 | Regular Grain | 331 | 102.7 | 4.0 | Alloy |
| 32 | 0 | 9.5 | Regular Grain | 362 | 111.5 | 3.5 | |
| 33 | 100 | 9.5 | Regular Grain | 210 | 66.5 | 4.0 | |
| 34 | 0 | 9.5 | Regular Grain | 365 | 112.0 | 3.0 | |
| 35 | 37 | 9.0 | Regular Grain | 350 | 108.3 | 4.0 | |
| 36 | 36 | 10.0 | Regular Grain | 349 | 108.1 | 2.0 | |
| 37 | 100 | 9.0 | Regular Grain | 213 | 67.5 | 4.0 | |
| 38 | 33 | 10.0 | Regular Grain | 310 | 94.0 | 2.0 | |
| 39 | 35 | 9.0 | Regular Grain | 307 | 93.3 | 4.0 | |
| 40 | 28 | 10.0 | Regular Grain | 313 | 95.3 | 4.0 | |
| 41 | 32 | 9.5 | Regular Grain | 314 | 95.5 | 4.0 | |
| 42 | 95 | 9.5 | Regular Grain | 240 | 75.5 | 4.0 | |
| 43 | 93 | 9.0 | Regular Grain | 251 | 78.5 | 4.0 | |
| 44 | 43 | 10.0 | Regular Grain | 349 | 108.2 | 4.0 | |

[1]Regular grains mean a structure which does not contain coarse grains of a crystal grain size No. 7 or smaller.
Mixed grains mean a structure which contains coarse grains of a crystal grain size of No. 7 or smaller.

TABLE 5

| Specimen Number | α30–400° C. (×10$^{-6}$/°C.) | Ag[2] Plating Property | Solderability[3] | Frequency of Rust Spot Occurrence (number of spots/100 cm$^2$) | Etching Factor | Note |
|---|---|---|---|---|---|---|
| 23 | 6.9 | ○ | ◎ | 0.0 | 2.4 | Alloy |
| 24 | 7.3 | ○ | ◎ | 0.5 | 2.5 | of the |
| 25 | 6.8 | ○ | ◎ | 0.3 | 2.4 | Present |
| 26 | 7.8 | ○ | ○ | 0.2 | 2.5 | Invention |
| 27 | 8.0 | ○ | ○ | 0.2 | 2.4 | |
| 28 | 7.9 | ○ | ○ | 0.3 | 2.5 | |
| 29 | 6.5 | ◎ | ○ | 0.0 | 2.5 | |
| 30 | 4.2 | X | X | 0.7 | 2.3 | Comparison |

TABLE 5-continued

| Specimen Number | $\alpha 30\text{--}400°$ C. ($\times 10^{-6}/°C.$) | Ag[2] Plating Property | Solderability[3] | Frequency of Rust Spot Occurrence (number of spots/100 cm$^2$) | Etching Factor | Note |
|---|---|---|---|---|---|---|
| 31 | 9.0 | ○ | Δ | 6.2 | 2.2 | Alloy |
| 32 | 9.2 | X | X | 5.5 | 2.2 | |
| 33 | 8.5 | ○ | ○ | 1.0 | 2.3 | |
| 34 | 11.0 | ○ | ○ | 0.8 | 2.3 | |
| 35 | 4.0 | X | X | 0.7 | 2.3 | |
| 36 | 7.4 | X | X | 0.7 | 2.2 | |
| 37 | 4.1 | X | X | 0.5 | 2.3 | |
| 38 | 8.0 | X | X | 0.7 | 2.3 | |
| 39 | 7.9 | X | X | 0.7 | 2.2 | |
| 40 | 8.0 | ○ | ◎ | 7.8 | 2.1 | |
| 41 | 7.9 | X | X | 1.1 | 2.1 | |
| 42 | 6.8 | X | X | 7.6 | 2.3 | |
| 43 | 8.5 | X | X | 8.1 | 2.3 | |
| 44 | 7.0 | ○ | ◎ | 10.2 | 2.0 | |

[2]Ag Plating Property:
○No Blisters;
X Blisters
[3]Solderability:
◎ wet time $t_2$ 0.5 sec or shorter;
○ wet time $t_2$ exceeds 0.5 sec and is 1.0 sec or shorter;
Δ wet time $t_2$ exceeds 1.0 sec and is 2.0 sec or shorter; and
X wet time exceeds 2.0 sec.

The residual austenite amounts in Table 4 were determined by the X-ray diffraction technique described above. The Ag plating property in Table 5 was determined by performing 0.5 μm-thick Cu strike plating on said alloy sheets after solvent degreasing, electrolytic degreasing, and acidification, and then applying 2 μm-thick Ag plating on them, heating them in an atmosphere at 450° C. for 5 minutes, and checking the plating layers for the presence of blisters at a magnification factor of 50.

Figure 2:
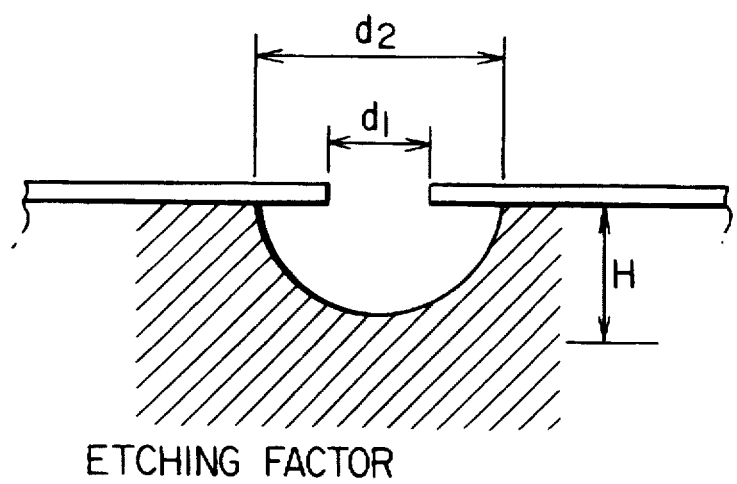
FIG. 2 is an explanatory drawing illustrating the method of measuring the etching factor.

The solderability in Table 5 was determined as follows:

1.5 μm-thick tin plating was applied to said alloy sheets, which were then immersed in a solder bath with a solder composition of 60% Sn and 40% Pb, a solder bath temperature of 235° C.±5° C., an immersion depth of 2 mm, and an immersion time of 5 seconds, using the Meniscograph method, and evaluation was performed with solder wet time $t_2$. For corrosion resistance, the salt spray test conforming to JIS Z 2371 was conducted on said alloy sheets for 100 hours, then the frequency of rust spot occurrence was examined. The etching factor was determined by performing photo etching and using the method shown in FIG. 2.

From the results in Tables 4 and 5, each of specimens Nos. 23 to 29 meets the component requirements of the present invention, exhibiting the structure, mechanical properties, superior repeated bending, thermal expansion, plating, etching, and corrosion resistance properties intended in the present invention. These properties are superior to those of the comparison examples. Specimens Nos. 23 to 25, and 29, in particular, have Si, P, S, O, and Cr reduced to more favorable levels within the ranges of the present invention, in contrast to specimens Nos. 26 to 28, thus exhibiting superior levels of solderability. In specimens Nos. 23, and 25 to 29, the elements necessary for the further improvement of corrosion resistance were added within the requirements of the present invention, in addition to Mo. It is clear that they have a lower frequency of rust spot occurrence and superior corrosion resistance compared with specimen No. 24 which contains none of these elements.

As compared with these examples of the present invention, specimen No. 44, whose Cr amount is less than the lower limit specified by the present invention, is extremely poor in corrosion resistance and etchability. This indicates that the addition of a proper amount of Cr is essential for the present invention. Specimen No. 30, whose C amount exceeds the upper limit specified by the present invention, has a residual austenite amount exceeding the upper limit specified by the present invention. Thus, the required strength cannot be obtained and the plating property is also poor. Specimen No. 31, whose C amount and 2Ni+Co+Mn amount are less than the lower limits of the present invention, has a residual austenite amount less than the requirement of the present invention, with the result that the required thermal expansion property cannot be obtained.

Specimen No. 32, whose Si amount exceeds the upper limit specified by the present invention and whose 2Ni+Co+Mn amount is less than the specified lower limit, has a residual austenite amount less than the lower limit specified by the present invention, and is poor in thermal expansion property with $\alpha_{30°\text{--}400°\,C.}$ exceeding $8 \times 10^{-6}/°C.$, and is also poor in plating property. Specimen No. 33, whose Mn amount exceeds the upper limit specified by the present invention and whose residual austenite amount exceeds the specified upper limit, cannot achieve the required strength. Specimen No. 34, whose Mn amount is less than the lower limit specified by the present invention, has a residual austenite amount less than the specified lower limit, and cannot achieve the required thermal expansion property.

Specimens Nos. 35 to 39, whose P, S, N, O, and Cr amounts exceed the upper limits specified by the present invention, each have plating properties inferior to those of the examples of the present invention. Specimens Nos. 36 and 38, in particular, have repeated bending behavior far inferior to the other comparison examples.

Specimen No. 41, whose H amount exceeds the upper limit specified by the present invention, has a plating property inferior to the examples of the present invention. Specimens Nos. 42 and 43, whose 2Ni+Co+Mn amounts exceed the upper limit specified by the present invention, both have residual austenite amounts exceeding the specified upper limit, and cannot achieve the required strength. Their Si amounts also exceed the upper limit specified by the present invention, resulting in poor plating property.

Specimens Nos. 40, 42, and 43 represent the alloy described in JP.A 166340/1991. None of these materials can achieve the Ag plating property, solderability, and the corrosion resistance intended in the present invention and it is clear that the intended effects cannot be achieved with the prior art alone. Specimen No. 40 is a case where Mo is less than the requirement of the present invention. In this case, the frequency of rust occurrence is far higher than in the examples of the present invention and the corrosion resistance is poor. This suggests that the addition of an appropriate amount of Mo is essential for the present invention.

As stated above, this embodiment has made it clear that the structure, mechanical properties, thermal expansion, plating, etching, and corrosion resistance properties intended in the present invention can only be achieved when the component requirements of the present invention are satisfied.

EMBODIMENT 3

The alloy of the present invention having the components of specimen No. 1 in Table 1 was melted in a vacuum melting furnace and cast into an ingot, which was then bloomed, hot rolled, descaled, and cleared of surface flaws to obtain a cold rolled material. Subsequently, the material underwent a series of processes shown in Table 6 below to provide 0.10 mm-thick alloy sheets, which were investigated with the same technique as in embodiment 1 for the property values shown in Tables 7 and 8.

TABLE 6

| Specimen Number | Primary Cold Rolling Ratio $CR_1$ (%) | Primary ** Annealing $T_1$ (°C.) | Secondary Cold Rolling Ratio $CR_2$ (%) | Secondary ** Annealing $T_2$ (°C.) | Tertiary Cold Rolling Ratio $CR_3$ (%) | Note |
|---|---|---|---|---|---|---|
| 45 | 60 | 730 | 75 | 720 | 60 | Alloy |
| 46 | 67 | 730 | 80 | 720 | 40 | of the |
| 47 | 78 | 700 | 83 | 720 | 20 | Present |
| 48 | 65 | 740 | 76 | 720 | 70 | Invention |
| 49 | 75 | 710 | 80 | 740 | 35 | |
| 50 | 65 | 740 | 85 | 700 | 50 | |
| 51 | 85 | 730 | 75 | 720 | 60 | Comparison |
| 52 | 50 | 730 | 75 | 720 | 60 | Alloy |
| 53 | 60 | 750 | 75 | 720 | 60 | |
| 54 | 60 | 680 | 75 | 720 | 60 | |
| 55 | 65 | 740 | 88 | 720 | 25 | |
| 56 | 72 | 710 | 70 | 720 | 60 | |
| 57 | 60 | 730 | 75 | 760 | 60 | |
| 58 | 60 | 730 | 75 | 680 | 60 | |
| 59 | 60 | 740 | 75 | 720 | 90 | |
| 60 | 70 | 730 | 85 | 720 | 10 | |
| 61 * | 88 | 750 | 71 | 650 | — | |

\* Solution treatment performed at 1,000° C. for one hour before primary cold rolling.

\*\* Retention time is 2 min.

TABLE 7

| Specimen Number | Structure | | | Mechanical Properties | | | Note |
|---|---|---|---|---|---|---|---|
| | Residual Austenite Content (%) | Crystal Grain Size Number | Regular Grain Degree | Hardness (Hv) | Tensile Strength (kgf/mm$^2$) | Repeated bending Behavior (times) | |
| 45 | 40 | 10.0 | Regular Grain | 338 | 106.0 | 2.5 | Alloy |
| 46 | 68 | 9.5 | " | 324 | 101.2 | 3.0 | of the |
| 47 | 90 | 9.0 | " | 280 | 85.2 | 3.5 | Present |
| 48 | 30 | 10.0 | " | 342 | 107.3 | 2.5 | Invention |
| 49 | 74 | 8.5 | " | 319 | 97.3 | 3.0 | |
| 50 | 54 | 10.5 | " | 333 | 104.5 | 3.0 | |
| 51 | 40 | 8.0 | Mixed Grain | 325 | 101.5 | 1.5 | Comparison |
| 52 | 39 | 7.5 | Regular Grain | 323 | 101.2 | 1.5 | Alloy |
| 53 | 38 | 7.5 | Mixed Grain | 316 | 96.5 | 1.0 | |
| 54 | 40 | 8.0 | Mixed Grain | 324 | 101.3 | 1.0 | |
| 55 | 80 | 8.0 | Mixed Grain | 272 | 84.0 | 1.5 | |
| 56 | 41 | 7.0 | Regular Grain | 307 | 93.5 | 1.0 | |
| 57 | 35 | 7.0 | Mixed Grain | 297 | 89.7 | 0.5 | |
| 58 | 37 | 8.0 | Mixed Grain | 320 | 97.0 | 1.0 | |
| 59 | 18 | 9.0 | Regular Grain | 348 | 119.3 | 2.0 | |
| 60 | 98 | 9.0 | Regular Grain | 245 | 76.0 | 5.5 | |
| 61 | 92: including 63% inverse transformation austenite | 6.5 | Regular Grain | 275 | 85.0 | 1.0 | |

(Method of evaluating each property value is the same as in Table 2)

TABLE 8

| Specimen Number | $\alpha_{30-400°C}$ ($\times 10^{-6}$/°C) | Ag Plating Property | Solder-ability | Frequency of Rust Spot Occurrence (number of spots/100 cm$^2$) | Etching Factor | Note |
|---|---|---|---|---|---|---|
| 45 | 6.9 | ○ | ○ | 0.0 | 2.4 | Alloy |
| 46 | 5.5 | ○ | ○ | 0.0 | 2.4 | of the |
| 47 | 4.5 | ○ | ○ | 0.0 | 2.4 | Present |
| 48 | 7.8 | ○ | ○ | 0.0 | 2.5 | Invention |
| 49 | 5.1 | ○ | ○ | 0.0 | 2.4 | |
| 50 | 6.3 | ○ | ○ | 0.0 | 2.4 | |
| 51 | 6.9 | ○ | ○ | 0.0 | 2.1 | Comparison |
| 52 | 7.0 | ○ | ○ | 0.1 | 2.3 | Alloy |
| 53 | 7.2 | ○ | ○ | 0.0 | 2.1 | |
| 54 | 7.0 | ○ | ○ | 0.0 | 2.1 | |
| 55 | 4.8 | ○ | ○ | 0.1 | 2.1 | |
| 56 | 6.8 | ○ | ○ | 0.1 | 2.3 | |
| 57 | 7.5 | ○ | ○ | 0.1 | 2.1 | |
| 58 | 7.1 | ○ | ○ | 0.1 | 2.1 | |
| 59 | 9.6 | ○ | ○ | 0.0 | 2.3 | |
| 60 | 4.2 | ○ | ○ | 0.1 | 2.3 | |
| 61 | 4.4 | △ | ○ | 5.0 | 1.9 | |

(Method of evaluating each property value is the same as in Table 3)

As indicated in Tables 6 to 8, specimens Nos. 45 to 50 meet all the production conditions specified by the present invention, exhibiting the structure, mechanical properties, thermal expansion, plating, etching, and corrosion resistance properties intended in the present invention. On the other hand, specimens Nos. 51 and 55 are respectively the cases where $CR_1$ and $CR_2$ exceed the upper limits specified by the present invention. They have mixed grain structures and the required repeated bending and etching properties are not obtained. Specimens Nos. 52 and 56 are respectively the cases where $CR_1$ and $CR_2$ are less than the lower limits specified by the present invention. The crystal grain size Nos. of their structures are smaller than the lower limit specified by the present invention and the required repeated bending and etching properties are not obtained.

Specimens Nos. 53 and 57 are respectively the cases where $T_1$ and $T_2$ exceed the upper limits specified by the present invention. They have mixed grain structures, and their crystal grain size Nos. are smaller than the lower limit specified by the present invention, thus, the required repeated bending and etching properties are not obtained. Specimens Nos. 54 and 58 are respectively the cases where $T_1$ and $T_2$ are less than the lower limits specified by the present invention. They have mixed grain structures and the required repeated bending and etching properties are not obtained.

The above indicates that controlling the primary and the secondary cold rolling ratios and the annealing temperature is extremely important for the crystal grain size and the regular grain degree of the structure, and that this control enables repeated bending and etching properties to be improved.

Specimens Nos. 59 and 60 are respectively the cases where $CR_3$ exceeds the upper limit and is less than the lower limit specified by the present invention. In the former case, the residual austenite amount is less than the lower limit specified by the present invention and the required thermal expansion and repeated bending behavior are not obtained. In the latter case, the residual austenite amount exceeds the upper limit specified by the present invention and the required strength is not obtained.

Specimen No. 61 is the case where the production method of J.P.A 166340/1991 was adopted. The austenite amount exceeds the upper limit specified by the present invention and the structure is of mixed grains and the crystal grain size No. exceeds the upper limit specified by the present invention. The austenite amount was 29% before secondary annealing and 63% of inverse transformation austenite was produced by secondary annealing. This material is inferior to the examples of the present invention in strength, repeated bending, plating, corrosion resistance, and etching properties. It is clear that the effects intended in the present invention cannot be achieved with the background art.

More specifically, according to the present invention, cold rolled material does not undergo solution treatment at 1000° C. for one hour and by eliminating said solution treatment, it is possible to adjust the crystal grain size and the regular grain degree of the final structure.

As stated above, the production conditions specified in the present invention are also important requirements in order to accurately achieve the structure, mechanical properties, thermal expansion, plating, and etching properties which are the object of this invention.

EMBODIMENT 4

The alloy of the present invention having the components of specimen No. 1 in Table 1 was melted in a vacuum melting furnace and cast into an ingot, which was then bloomed, hot rolled, descaled, and cleared of surface flaws to obtain a cold rolled material. Subsequently, the material underwent a series of processes shown in Table 9 below to provide 0.10 mm-thick alloy sheets, which were investigated with the same technique as in embodiment 1 for the property values shown in Tables 10 and 11.

TABLE 9

| Specimen Number | Primary Cold Rolling Ratio $Cr_1$ (%) | Primary** Annealing $T_1$ (°C.) | Secondary Cold Rolling Ratio $CR_2$ (%) | Secondary** Annealing $T_2$ (°C.) | Tertiary Cold Rolling Ratio $CR_3$ (%) | Low Temp. Heat Treatment Temp. $T_3$ (°C.) | Low Temp. Heat Treatment Time t (min) | Note |
|---|---|---|---|---|---|---|---|---|
| 62 | 60 | 730 | 75 | 720 | 60 | 500 | 1 | Alloy |
| 63 | 67 | 730 | 80 | 720 | 40 | " | " | of the |
| 64 | 78 | 700 | 83 | 720 | 20 | " | " | Present |
| 65 | 65 | 740 | 76 | 720 | 70 | " | " | Invention |
| 66 | 75 | 710 | 80 | 740 | 35 | 450 | 20 | |
| 67 | 65 | 740 | 85 | 700 | 50 | 540 | 0.5 | |
| 68 | 85 | 730 | 75 | 720 | 60 | 500 | 1 | Comparison |
| 69 | 50 | " | " | " | " | " | " | Alloy |
| 70 | 60 | 750 | " | " | " | " | " | |
| 71 | " | 680 | " | " | " | " | " | |
| 72 | 65 | 740 | 88 | " | 25 | " | " | |
| 73 | 72 | 710 | 70 | " | 60 | " | " | |
| 74 | 60 | 730 | 75 | 760 | " | 500 | 1 | |
| 75 | " | " | " | 680 | " | " | " | |
| 76 | 60 | 740 | 75 | 720 | 90 | " | " | |
| 77 | 70 | 730 | 85 | " | 10 | " | " | |
| 78 | 60 | " | 75 | " | 60 | 550 | 1 | |
| 79 | " | " | " | " | " | 380 | 30 | |
| 80 | " | " | " | " | " | 500 | 60 | |
| 81 | " | " | " | " | " | " | 0.2 | |
| 82* | 88 | 750 | 71 | 650 | — | — | — | |

*Solution treatment prtformed at 1,000° C. for one hour before primary cold rolling.
**Retention time is 2 min.

TABLE 10

| | Structure | | | Mechanical Properties | | | |
|---|---|---|---|---|---|---|---|
| Specimen Number | Residual Austenite Content (%) | Crystal Grain Size Number | Regular Grain Degree | Hardness (Hv) | Tensile Strength (kgf/mm$^2$) | Repeated bending Behavior (times) | Note |
| 62 | 40 | 10.0 | Regular Grain | 346 | 107.5 | 4.5 | Alloy |
| 63 | 68 | 9.5 | " | 330 | 102.8 | 5.5 | of the |
| 64 | 90 | 9.0 | " | 280 | 85.5 | 6.5 | Present |
| 65 | 30 | 10.0 | " | 352 | 109.0 | 4.0 | Invention |
| 66 | 74 | 8.5 | " | 321 | 99.0 | 5.5 | |
| 67 | 54 | 10.5 | " | 340 | 105.8 | 6.0 | |
| 68 | 40 | 8.0 | Mixed Grain | 327 | 102.5 | 3.5 | Comparison |
| 69 | 39 | 7.5 | Regular Grain | 325 | 102.1 | 3.5 | Alloy |
| 70 | 38 | 7.5 | Mixed Grain | 320 | 98.0 | 3.0 | |
| 71 | 40 | 8.0 | Mixed Grain | 326 | 102.4 | 3.0 | |
| 72 | 80 | 8.0 | Mixed Grain | 275 | 84.5 | 3.5 | |
| 73 | 41 | 7.0 | Regular Grain | 310 | 95.0 | 3.0 | |
| 74 | 35 | 7.0 | Mixed Grain | 300 | 90.0 | 2.5 | |
| 75 | 37 | 8.0 | Mixed Grain | 323 | 102.0 | 3.0 | |
| 76 | 18 | 9.0 | Regular Grain | 362 | 112.0 | 3.5 | |
| 77 | 98 | 9.0 | Regular Grain | 245 | 76.5 | 7.5 | |
| 78 | 60 (incl 20% inverse transformation austenite) | 10.0 | Regular Grain | 270 | 82.5 | 2.0 | |
| 79 | 40 | 10.0 | Regular Grain | 339 | 106.5 | 3.5 | |
| 80 | 51 (incl 11% inverse transformation austenite) | 10.0 | Regular Grain | 275 | 83.7 | 3.0 | |
| 81 | 42 | 10.0 | Regular Grain | 339 | 106.6 | 2.5 | |
| 82 | 92 (incl 63% inverse transformation austenite) | 6.5 | Mixed Grain | 275 | 85.0 | 1.0 | |

(Method of evaluating each property value is the same as in Table 2)

TABLE 11

| Specimen Number | $\alpha_{30-400°C.}$ ($\times 10^{-6}$/°C.) | Ag Plating Property | Solderability | Frequency of Rust Spot Occurrence (number of spots/100 cm$^2$) | Etching Factor | Note |
|---|---|---|---|---|---|---|
| 62 | 6.9 | ○ | ◎ | 0.0 | 2.4 | Alloy |
| 63 | 5.5 | ○ | ◎ | 0.0 | 2.5 | of the |
| 64 | 4.5 | ○ | ◎ | 0.0 | 2.4 | Present |
| 65 | 7.8 | ○ | ◎ | 0.0 | 2.4 | Invention |
| 66 | 5.1 | ○ | ◎ | 0.0 | 2.4 | |
| 67 | 6.3 | ○ | ◎ | 0.0 | 2.4 | |

TABLE 11-continued

| Specimen Number | $\alpha_{30-400°C.}$ ($\times 10^{-6}$/°C.) | Ag Plating Property | Solder-ability | Frequency of Rust Spot Occurrence (number of spots/100 cm$^2$) | Etching Factor | Note |
|---|---|---|---|---|---|---|
| 68 | 6.9 | ◯ | ◯ | 0.0 | 2.2 | Comparison |
| 69 | 7.0 | ◯ | ◯ | 0.1 | 2.2 | Alloy |
| 70 | 7.2 | ◯ | ◯ | 0.0 | 2.1 | |
| 71 | 7.0 | ◯ | ◯ | 0.0 | 2.1 | |
| 72 | 4.8 | ◯ | ◯ | 0.1 | 2.1 | |
| 73 | 6.8 | ◯ | ◯ | 0.1 | 2.3 | |
| 74 | 7.5 | ◯ | ◯ | 0.1 | 2.1 | |
| 75 | 7.1 | ◯ | ◯ | 0.1 | 2.2 | |
| 76 | 9.6 | ◯ | ◯ | 0.0 | 2.2 | |
| 77 | 4.2 | ◯ | ◯ | 0.1 | 2.3 | |
| 78 | 5.4 | △ | ◯ | 3.0 | 2.2 | |
| 79 | 6.9 | ◯ | ◉ | 0.1 | 2.2 | |
| 80 | 6.5 | △ | ◯ | 2.0 | 2.1 | |
| 81 | 6.8 | ◯ | ◉ | 0.1 | 2.1 | |
| 82 | 4.4 | △ | ◯ | 5.0 | 1.9 | |

(Method of evaluating each property value is the same as in Table 2)

As indicated in Tables 9 to 11, specimens Nos. 62 to 67 meet all the production conditions specified by the present invention, exhibiting the structure, mechanical properties, thermal expansion, plating, etching, and corrosion resistance properties intended in the present invention. On the other hand, specimens Nos. 68 and 72 are respectively the cases where $CR_1$ and $CR_2$ exceed the upper limits specified by the present invention. They have mixed grain structures and the required repeated bending and etching properties are not obtained. Specimens Nos. 69 and 73 are respectively the cases where $CR_1$ and $CR_2$ are less than the lower limits specified by the present invention. The crystal grain size Nos. of their structures are smaller than the lower limit specified by the present invention and the required repeated bending and etching properties are not obtained.

Specimens Nos. 70 and 74 are respectively the cases where $T_1$ and $T_2$ exceed the upper limits specified by the present invention. Their structures are of mixed grains, and their crystal grain size Nos. are smaller than the lower limit specified by the present invention, and the required repeated bending and etching properties are not obtained. Specimens Nos. 71 and 75 are respectively the cases where $T_1$ and $T_2$ are less than the lower limits specified by the present invention. Their structures are of mixed grains and the required repeated bending and etching properties are not obtained.

The above indicates that controlling the primary and the secondary cold rolling ratios and the annealing temperature is extremely important for the crystal grain size and the regular grain degree of the structure, and that this control enables repeated bending and etching properties to be improved.

Specimens Nos. 76 and 77 are respectively the cases where $CR_3$ exceeds the upper limit and is less than the lower limit specified by the present invention. In the former case, the residual austenite amount is less than the lower limit specified by the present invention and the required thermal expansion property is not obtained. In the latter case, the residual austenite amount exceeds the upper limit specified by the present invention and the required strength is not obtained.

Specimens Nos. 78 and 80 are respectively the cases where $T_3$ and t exceed the upper limits specified by the present invention. In both cases, the residual austenite amount before the final heat treatment was 40%. For No. 78, 20% of inverse transformation austenite was produced and for No. 80, 11% of inverse transformation austenite was produced. These materials cannot provide the required strength, repeated bending and etching properties, and are inferior to the examples of the present invention in plating and corrosion resistance properties. Specimens Nos. 79 and 81 are respectively the cases where $T_3$ and t are less than the lower limits specified by the present invention, and the required repeated bending property is not obtained.

Examples Nos. 78 to 81 above indicate that it is necessary to apply a proper final heat treatment in order to obtain the structure, mechanical properties, thermal expansion, plating, and corrosion resistance properties intended in the present invention.

Specimen No. 82 is the case where the production method of JP.A 166340/1991 was adopted. The austenite amount exceeds the upper limit specified by the present invention and the structure is of mixed grains and the crystal grain size No. exceeds the upper limit specified by the present invention. The austenite amount was 29% before the secondary annealing and 63% of inverse transformation austenite was produced by secondary annealing.

This material is inferior to the examples of the present invention in strength, repeated bending, plating, corrosion resistance, and etching properties. It is clear that the effects intended in the present invention cannot be achieved with the background art.

More specifically, according to the present invention, cold rolled material does not undergo solution treatment at 1000° C. for one hour and by eliminating said solution treatment, it is possible to adjust the crystal grain size and the regular grain degree of the final structure.

As stated above, the production conditions specified in the present invention are also important requirements for accurately achieving the structure, mechanical properties, thermal expansion, plating, and etching properties which are the object of this invention.

Industrial Applicability

The present invention thus described provides an alloy sheet with a specific Fe—Ni—Co composition which has the high degree of strength necessary for multiple-pin thin plate lead frames as well as excellent repeated bending behavior, required thermal expansion, plating, corrosion resistance, and etching properties. Said alloy sheet may be produced properly by controlling the final structure and the residual austenite amount with the optimization of the post-heat-rolling cold rolling of the alloy with said composition, the annealing conditions, the final cold working, and also heat treatment.

We claim:

1. A high-strength thin plate of an iron-nickel-cobalt alloy excellent in corrosion resistance, repeated bending behavior and etchability consisting essentially of, in weight %:

Ni: 27–30%, Co: 5–18%, Mn: 0.10–3.0%, and Si: 0.10% or less, and the contents of Ni, Co, and Mn satisfying the relationships:

63.5%≦2Ni+Co+Mn≦65.0%, if Co is less than 10% and 69.5%≦2Ni+Co+Mn≦74.5%, if Co is 10% or more, C: 0.010–0.075%, N: 0.001–0.014%, H: 0.5 to less than 2.0 ppm, S: 0.0040% or less, P: 0.004% or less, O: 0.0050% or less, Cr: 0.01–0.06%, Mo: 0.01–1.0% and optionally a total of up to 0.50% of at least one element selected from the group consisting of B, Nb, Ti, Zr, Ta, V and W, the remainder being Fe and unavoidable impurities, having a residual austenite amount of 30–90%, and having crystal grains which are regular and have a grain size of No. 8 or larger.

2. A high-strength thin plate of an iron-nickel-cobalt alloy excellent in corrosion resistance, repeated bending behavior and etchability according to claim 1, wherein the alloy contains a total of 0.01–0.50% of said at least one element selected from the group consisting of B, Nb, Ti, Zr, Ta, V, and W.

3. A high-strength thin plate of an iron-nickel-cobalt alloy excellent in corrosion resistance, repeated bending behavior and etchability according to claim 1, wherein the plate has an average thermal expansion coefficient measured between 30° to 400° C. of 4|~8|×10$^{-6}$/°C., to 8×10$^{-6}$/° C., a Vickers hardness (Hv) of 280 or higher, and a tensile strength of 85 kgf/mm$^2$ or larger.

4. A method of producing a thin plate of an iron-nickel-cobalt alloy excellent in corrosion resistance, repeated bending behavior and etchability of claim 1 comprising subjecting the alloy to primary cold rolling, primary annealing, secondary cold rolling, secondary annealing, and tertiary cold rolling, wherein the primary cold rolling is carried out at a cold rolling rate of 60–80%;

the primary annealing is carried out at a temperature of 700°–740° C.;

the secondary cold rolling is carried out at a cold rolling rate of 75–85%;

the secondary annealing is carried out at a temperature of 700°–740° C.; and the tertiary cold rolling is carried out at a cold rolling rate of 20–70%.

5. A method of producing a thin plate of an iron-nickel-cobalt alloy excellent in corrosion resistance, repeated bending behavior and etchability of claim 2 comprising subjecting the alloy to primary cold rolling, primary annealing, secondary cold rolling, secondary annealing, and tertiary cold rolling, wherein the primary cold rolling is carried out at a cold rolling rate of 60–80%;

the primary annealing is carried out at a temperature of 700°–740° C.;

the secondary cold rolling is carried out at a cold rolling rate of 75–85%;

the secondary annealing is carried out at a temperature of 700°–740° C.; and the tertiary cold rolling is carried out at a cold rolling rate of 20–70%.

6. A method of producing a thin plate of an iron-nickel-cobalt alloy excellent in corrosion resistance, repeated bending behavior and etchability of claim 1 comprising subjecting the alloy to primary cold rolling, primary annealing, secondary cold rolling, secondary annealing, tertiary cold rolling, and low temperature heat treatment, wherein the primary cold rolling is carried out at a cold rolling rate of 60–80%;

the primary annealing is carried out at a temperature of 700°–740° C.;

the secondary cold rolling is carried out at a cold rolling rate of 75–85%;

the secondary annealing is carried out at a temperature of 700°–740° C.;

the tertiary cold rolling is carried out at a cold rolling rate of 20–70%; and the low temperature heat treatment is carried out at a temperature of 400°–540° C. and for a time of 0.5–30 min.

7. A method of producing a thin plate of an iron-nickel-cobalt alloy excellent in corrosion resistance, repeated bending behavior and etchability of claim 2 comprising subjecting the alloy to primary cold rolling, primary annealing, secondary cold rolling, secondary annealing, tertiary cold rolling, and low temperature heat treatment, wherein the primary cold rolling is carried out at a cold rolling rate of 60–80%;

the primary annealing is carried out at a temperature of 700°–740° C.;

the secondary cold rolling is carried out at a cold rolling rate of 75–85%;

the secondary annealing is carried out at a temperature of 700°–740° C.;

the tertiary cold rolling is carried out at a cold rolling rate of 20–70%; and the low temperature heat treatment is carried out at a temperature of 400°–540° C.; and for a time of 0.5 to 30 min.

8. A high-strength thin plate of an iron-nickel-cobalt alloy excellent in corrosion resistance, repeated bending behavior and etchability according to claim 2, wherein the plate has an average thermal expansion coefficient measured between 30° to 400° C. of 4×10$^{-6}$/°C. to 8×10$^{-6}$/°C., a Vickers hardness (Hv) of 280 or higher, and a tensile strength of 85 kgf/mm$^2$ or larger.

9. A high-strength thin plate of an iron-nickel-cobalt alloy excellent in corrosion resistance, repeated bending behavior and etchability according to claim 1, wherein the hydrogen content is 1.0 ppm or less.

10. A high-strength thin plate of an iron-nickel-cobalt alloy excellent in corrosion resistance, repeated bending behavior and etchability according to claim 1, wherein the hydrogen content is 0.5 to 1.0 ppm.

* * * * *